United States Patent

[11] 3,551,760

[72] Inventors Takashi Tokuyama; Shigeru Nishimatsu; Keijiro Uehara; Takaaki Mori, Tokyo, Japan

[21] Appl. No. 625,523

[22] Filed Mar. 23, 1967

[45] Patented Dec. 29, 1970

[73] Assignee Hitachi, Ltd. Tokyo, Japan a corporation of Japan

[32] Priority Mar. 28, 1966

[33] Japan

[31] No. 41/18721

[54] SEMICONDUCTOR DEVICE WITH AN INVERSION PREVENTING LAYER FORMED IN A DIFFUSED REGION

16 Claims, 15 Drawing Figs.

[52] U.S. Cl. .......... 317/235

[51] Int. Cl. .......... H01l 11/06

[50] Field of Search .......... 317/235—46, .21, 21.1, 46, 46.1, 234, 7, 9, 40.1, 48.1, 48.2

[56] References Cited

UNITED STATES PATENTS

| | | | |
|---|---|---|---|
| 3,226,611 | 12/1965 | Haenichen | 317/234 |
| 3,242,394 | 3/1966 | Biard | 317/235 |
| 3,365,627 | 1/1968 | Lindmayer et al. | 317/234 |
| 3,384,829 | 5/1968 | Sato | 330/7 |
| 3,386,016 | 5/1968 | Lindmayer | 317/235 |
| 3,283,170 | 11/1966 | Buie | 307/88.5 |

FOREIGN PATENTS

| | | | |
|---|---|---|---|
| 667,423 | 7/1963 | Canada | 317/235—46 |

*Primary Examiner*—Jerry D. Craig
*Attorney*—Craig, Antonelli, Stewart & Hill

ABSTRACT: A semiconductor device in which a $p^+$-type inversion preventing layer with high impurity concentration is formed in a p-type base diffused region in the vicinity of and including the edge portion of a collector-base junction to prevent induction of an $n^+$-type inversion layer and hence an abnormal increase in the backward current.

INVENTORS
TAKASHI TOKUYAMA
SHIGERU NISHIMATSU
KEIJIRO UEHARA
TAKAAKI MORI

BY Paul M. Craig, Jr.
ATTORNEY

INVENTORS
TAKASHI TOKUYAMA
SHIGERU NISHIMATSU
KEIJIRO UEHARA
TAKAAKI MORI

BY Paul M. Craig, Jr.
ATTORNEY

INVENTORS
TAKASHI TOKUYAMA
SHIGERU NISHIMATSU
KEIJIRO UEHARA
TAKAAKI MORI

BY Paul M. Craig, Jr.
ATTORNEY

SEMICONDUCTOR DEVICE WITH AN INVERSION PREVENTING LAYER FORMED IN A DIFFUSED REGION

The present invention relates to a semiconductor device having a p-n junction, and more particularly to a semiconductor device in which end portion of the p-n junction is protected by an insulating protective layer.

It is known that generally a silicon dioxide film covering the surface of a semiconductor substrate has a tendency to render the conductivity-type of the surface portion of the semiconductor substrate n-type, and when the semiconductor substrate is of high resistivity and of p-type, an n-type inversion layer (n-type induced channel) is formed at the surface portion of the substrate abutting on the silicon dioxide film, and when the substrate is of n-type, a more intensely n-type layer is formed at that surface portion. Such phenomenon is generally called the channel effect.

When the electron (or hole) density at the surface of the semiconductor substrate is different from that in the interior thereof, due to the provision of the insulating protective layer on the surface of the substrate, the charge density per unit are $N_{FB}$cm$^2$ required for developing an external electric field just to restore the electron (or hole) density at the surface of the substrate to the state in which no insulating protective layer has been provided, i.e., to the state in which the above-mentioned effect of rendering the conductivity-type of the surface portion n-type has been canceled, is a measure of the capability of rendering the conductivity-type of the surface portion of the semiconductor substrata n-type.

When the acceptor concentration in a p-type silicon substrate is represented by $N_A$, the relation between the acceptor concentration $N_A$ and the above-mentioned charge density $N_{FB}$ is as shown in FIG. 1 (in FIG. 1 coordinates are calibrated in logarithm). It is seen from FIG. 1 that a substrate having an acceptor concentration $N_A = 10^{18}/cm^3$ is converted into n-type to form an n-type channel at its surface portion when the charge density $N_{FB}$ is $3 \times 10^{12}/cm^2$ or higher, while no inversion of conductivity type takes place when the charge density $N_{FB}$ is lower than that value. However, in a substrate having an acceptor concentration $N_A = 10^{16}/cm^3$, the n-type channel is formed even at a charge density $N_{FB} = 2 \times 10^{11}/cm^2$. From the above facts it is understood that the smaller the value of the charge density $N_{FB}$ at the surface of a semiconductor substrate is, the less the degree of the tendency to become n-type is. Such a surface is considered to be a preferred surface.

There are various assumptions as to the cause of such tendency of the surface of the semiconductor substrate to become n-type, One of the most promising causes thereof is assumed to be the influence of positive charges, in particular sodium ions, introduced into the insulating protective layer due to contamination. According to this assumption, because of the existence of positive charges in a silicon oxide layer, for example, electrons are induced at the surface portion of the silicon substrate contacting the silicon oxide layer so as to neutralize the positive charges, resulting in the tendency of the conductivity-type of the surface portion to become n-type, i.e., resulting in the formation of an n-type channel. This assumption is further supported by the fact that the tendency of the surface to become n-type is suppressed to a certain degree by avoiding the introduction of positive charge into the silicon oxide layer in the manufacturing process of the semiconductor device, in particular in formation of the silicon oxide layer, or, in other words, by endeavoring at keeping the environment in which the process is performed as clean as possible.

The degree of capability of silicon oxide to render the conductivity-type of the surface portion of a silicon substrate n-type is considered to depend on the locations of positive charges in the silicon oxide. It is known that if the positive charges concentrate in the portion of the silicon oxide layer adjacent to the silicon substrate, the number of the electrons induced at the surface portion of the silicon substrate becomes largest, as understood from Poisson's equation, whereas when the positive charges concentrate in the other side portion of the silicon oxide layer, the number of the electrons induced in the silicon substrate is smallest. Such properties of a surface insulating protective layer can easily be elucidated by analyzing the voltage versus capacity characteristics of MOS type capacitors.

The formation of a p-type channel is considered to result from the existence of numerous negative charges in the insulating film, as contrasted to the case of n-type channels. However, in the following, description will be made mainly with reference to an n-type channel for the sake of simplicity of the description because at present the problem often concerns the n-type channel induced in the silicon oxide film. It should be noted, however, that the present invention is not limited to the case of the n-type channel.

An n-type induced channel developed as stated above forms a current path from an n-type region to the surface portion of a semiconductor body which is not covered by an insulating film, or connects a plurality of n-type regions formed in spaced relation with each other, and hence has been a cause for increased leakage current or backward current in a semiconductor device composed of a high resistivity p-type semiconductor substrate.

In order to prevent the development of such an n-type induced channel, it was proposed in U.S. Pat. No. 3,226,611 to prevent the development of the n-type channel by forming, in a surface portion of a p-type substrate, a stronger p-type region than the substrate, whereby the leakage current or the backward current in a semiconductor device such as a pnp-type transistor having the structure that a p-type semiconductor body is coated with silicon dioxide is greatly reduced.

On the other hand, also in a semiconductor device such as an npn-type transistor comprising the structure that a p+-type diffused region is formed in an n-type semiconductor substrate, as shown in FIG. 2, or in a p+n-type diode, a phenomenon similar to the above-mentioned channel effect is observed, though faintly. Previously, this phenomenon was interpreted as resulting from the leakage current through a p-type or n-type induced inversion layer developed underneath an insulating film, similar to the case of the above-mentioned p-type substrate.

In case the silicon oxide film covering the surface of the semiconductor body has the tendency to render the conductivity-type of the surface portion of the semiconductor body n-type, the n-type inversion layer should not develop, and hence the backward current should not increase when the impurity concentration at the surface of said p+-type diffused region is sufficiently high to prevent the development of the n-type channel. However, in fact an increase in the backward current is sometimes observed during the operation of the device or after a bias-heat treatment test which will be described later. Furthermore, although the impurity concentration at the surface portion of said p+-type diffused region is in such a degree that the n-type inversion layer is expected, in fact such a large backward current as cannot be interpreted only in terms of the leakage current through the n-type inversion layer is observed at times.

In order for such semiconductor devices to maintain a sufficient reliability under various conditions of usage, they are usually subjected to the so-called bias-heat treatment test which forcibly brings the semiconductor devices to a deteriorated state by applying a backward voltage of a value nearly equal to the breakdown voltage to the p-n junction thereof for several hours at an elevated temperature of from 200 to 300° C. As a result of this bias-heat treatment the backward leakage current increases. The variation in the backward leakage current increases. The variation in the backward leakage current is shown in FIG. 3 in which the abscissa represents the backward voltage applied to the p–junction and the ordinate represents the backward leakage current in a logarithmic scale. As seen from FIG. 3, the variation in the backward leakage current ranges over several orders of magnitude.

Such a defective phenomenon is often observed in a semiconductor device having an insulating protective film, such as silicon dioxide film, provided on the surface thereof, and has been a big problem in the art from the yield and performance standpoints. In settling this problem, particularly in the case of a device, the substrate of which is composed of an n-type semiconductor, formation of an n+-type channel-preventing layer in the surface of the substrate is proposed on the assumption that a p-type inversion layer is generated in the surface of the n-type semiconductor substrate. However, from such a countermeasure favorable results cannot be expected. It is also difficult, when the insulating film has the tendency to render the conductivity-type of the surface portion of the silicon substrate n-type, as has been stated, to interpret the variation in the backward current ranging over several orders of magnitude at the time of use or at the time of bias-heat treatment as resulting from the backward leakage current through the inversion layer.

Therefore, an object of the present invention is to improve a semiconductor device having a defect which is difficult to be interpreted as resulting from the backward leakage current through an induced inversion layer.

Another object of the present invention is to provide a semiconductor device in which the backward leakage current is extremely low.

A further object of the present invention is to provide a semiconductor device of which the deterioration of the characteristics at the time of the bias-heat treatment or the deterioration with time is very slight and hence having stable characteristics.

Other objects and advantages of the present invention will become more apparent from the following detailed description of the invention with reference to the accompanying drawings, in which.

Figure 1:
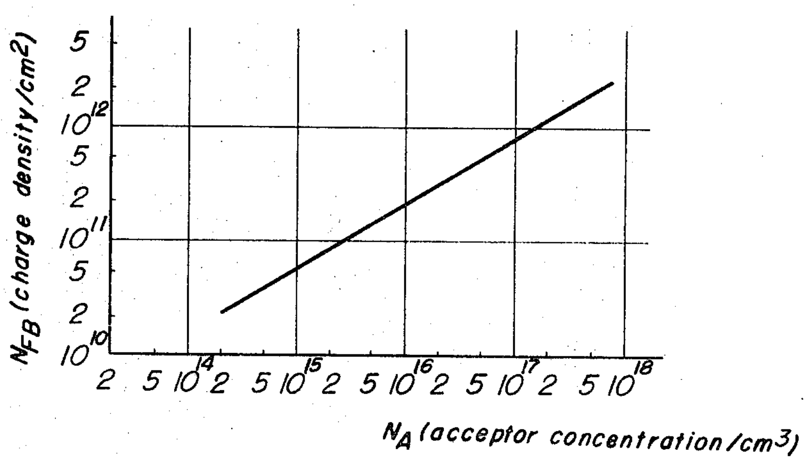
FIG. 1 PRIOR ART
FIG. 1 is a graph showing the relation between the surface charge density and the impurity concentration in a semiconductor substrate.
Figure 2:
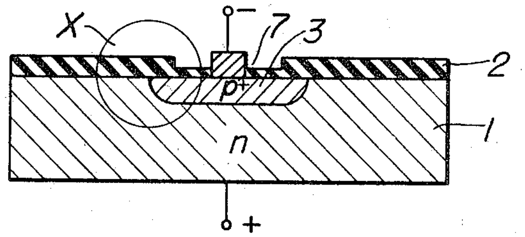
FIG. 2 PRIOR ART
FIG. 2 is a cross-sectional view of a conventional planar type semiconductor device.
Figure 3:
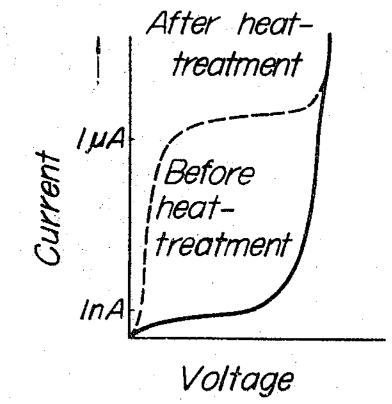
FIG. 3 PRIOR ART
FIG. 3 is a characteristic graph showing a degraded state of a conventional semiconductor device due to a bias-heat treatment.

In general, according to the manufacturing method of a planar type semiconductor device, a structure in which the end portion of a p-n junction is covered by a silicon oxide film 2 as shown in FIG. 2, is obtained by selectively diffusing a conductivity-type-determining impurity into a substrate 1 through a hole 7 formed in the silicon oxide film 2 provided on the silicon substrate 1 by employing the silicon oxide film 2 as a mask for the diffusion. The diffusion is usually carried out in an oxidizing atmosphere, at which time the silicon oxide film 2 is again formed in the hole 7. The diffused region 3 is indicated by p+ in order to show that the impurity concentration in the diffused region 3 is high.

Figure 4:
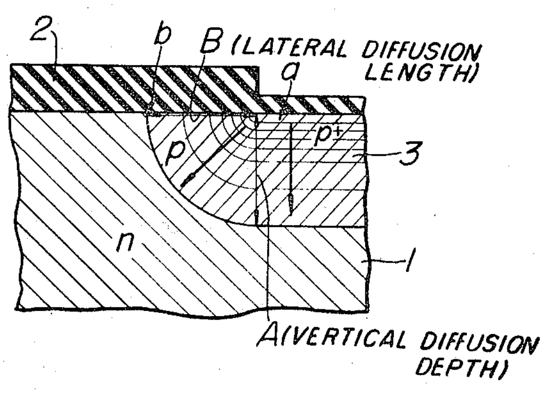
FIG. 4 PRIOR ART
FIG. 4 is an enlarged cross-sectional view showing the structure of the diffused region in the portion, indicated by X, of the planar type semiconductor device of FIG. 2.

Here, in order to sufficiently understand the present invention, it is necessary to examine the impurity distribution in the portion indicated by X in FIG. 2 or in the vicinity of the p-n junction in the p-type diffused region 3. An enlarged view of this portion is shown in FIG. 4. Since an impurity diffuses not only vertically, but also laterally in the substrate 1 as shown in FIG. 4, the distance B between the edge of the hole and the edge of the p-n junction reaching the surface of the semiconductor substrate is substantially equal to the diffusion depth A.

Describing in more detail the p-type region formed by the diffusion of impurity from the point of view of the distribution of the impurity concentration, the impurity concentration is largest at the bottom portion *a* of the hole, and it decreases approximately natural logarithmically as it departs from this portion. That is, the impurity concentration decreases in the directions of the arrows in FIG. 4.

The value which usually called the surface impurity concentration in the diffused region 3 is the value at the portion designated by *a* in FIG. 4. Therefore, even if the surface impurity concentration is, for example, $5\times10^{18}-10^{19}/cm^3$, the impurity concentration at the point *b* at which the p-n junction intersects the surface of the substrate 1 is several orders of magnitude lower than the value of the surface impurity concentration, for example of the order of $6\times10^{15}/cm^3$ which is approximately equal to the impurity concentration in the semiconductor substrate 1.

Figure 5:
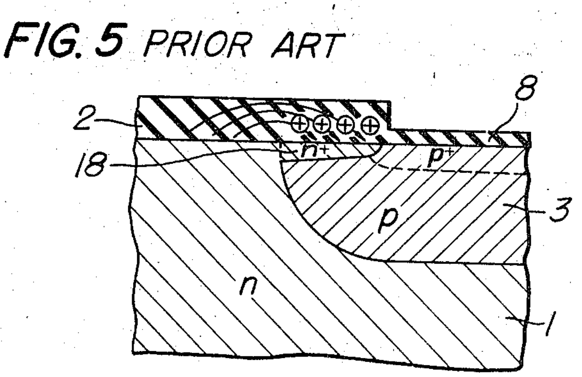
FIG. 5 PRIOR ART
FIG. 5 is a schematic diagram, in cross section, of an important portion of a conventional semiconductor device for explaining a cause of degradation of the characteristics thereof.

Generally, when a negative potential is applied to a p+-type diffused region 3 and a positive potential is applied to an n-type substrate 1, that is, when a backward bias is applied to a p-n junction as shown in FIG. 2, a part of the electric field applied to the p-n junction leaks over the edge of the p-n junction into an oxide film 2 on the surface of a semiconductor substrate 1 as indicated by arrows in FIG. 5.

As time elapses positive charges present in the oxide film 2 migrate into the portion of the oxide film 2 covering the p-type diffused region 3 due to such leakage electric field. The migrated positive charges are represented by ⊕ in FIG. 5. In particular, at the time of the above-mentioned bias-heat treatment, the positive charges are in a state of being apt to migrate, and hence migrate into the portion on the p-type region 3 in a short time. Consequently, accompanying such migration of the positive charges, electrons corresponding to the amount of the migrated positive charges are induced in the surface portion of the semiconductor substrate in the vicinity of the p-n junction, or in the surface portion of the p-type region 3.

In contrast to this, since the impurity concentration in the p-type diffused region 3 is remarkably low in the vicinity of the junction, as stated above, the conductivity type of the portion in the vicinity of the junction is easily inverted to form an n-type inversion layer 18 as shown in FIG. 5.

The equivalent impurity concentration in the n-type inversion layer 18 formed due to the inversion of the p-type diffused region 3 is considerably high, and hence the n-type inversion layer 18 is considered to have become an n+-type region. This n+-type region contacts the portion of high impurity concentration (the portion designated by p+) of the p-type diffused region 3. Consequently, a semiconductor device in which such an inversion layer 18 is formed has a p+–n+ type junction in the vicinity of the surface of the substrate thereof. When a backward bias is applied to this p+–n+junction, a local tunnel phenomenon takes place through the p+–n+ junction. According to assumption, the above-mentioned abnormal behavior of increase in the backward current is well explained.

Figure 6:
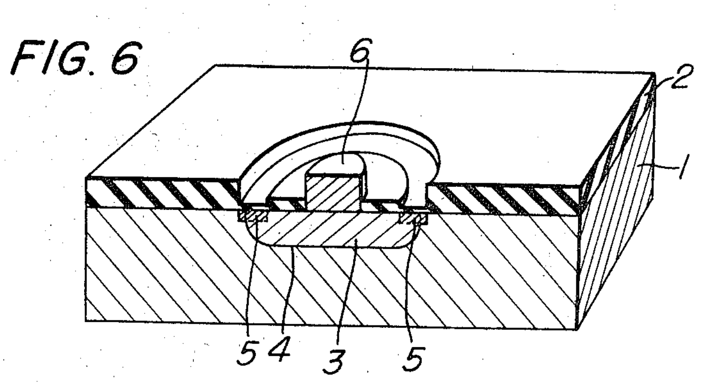
FIG. 6 is a perspective view of an embodiment of the present invention in section.

In order to prevent such a tunnel phenomenon, that is, in order to prevent formation of the n-type inversion layer 18 extending from the p-n junction to the p+-type diffused region in the vicinity of the surface of the substrate 1, the present invention proposes the provision of a p+-type layer 5 with high impurity concentration at and in the vicinity of the p-n junction near the surface of the p-type diffused region 3, a typical structure thereof being shown in FIG. 6. The device shown in FIG. 6 is a diode, in which reference numeral 1 designates a semiconductor substrate made of a material such as silicon, germanium etc.; 2 designates an insulating film such as a silicon dioxide film etc. provided on the surface of the substrate 1; 3 designates a region having the conductivity type opposite to that of the substrate 1 formed therein; 4 designates a p-n junction formed between the substrate 1 and the region 3; 5 designates a region, formed according to the present invention, with high impurity concentration having the same conductivity type as that of the region 3; and 6 designates an electrode making an ohmic contact with the region 3. The region 5 is formed in a ring shape along the edge of the p-n junction 4. In the present invention it is necessary for the region 5 to be formed on the region 3, including the edge portion of the p-n junction 4.

The manufacturing process of a semiconductor device having the structure of FIG. 6 is shown in FIGS. 7 to 10.

Figure 7:
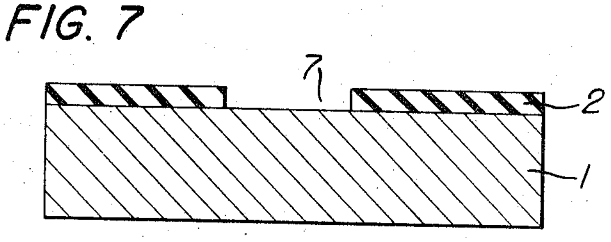
FIGS. 7 to 10 are schematic diagrams for showing various steps of the manufacturing process of a semiconductor device according to the present invention.
Figure 8:
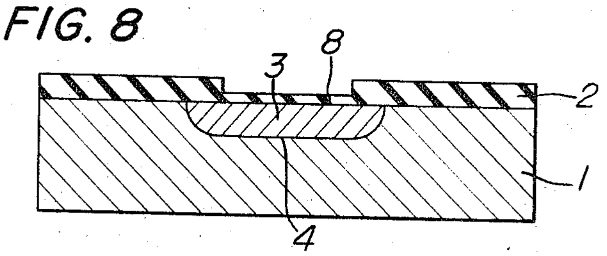
Figure 9:
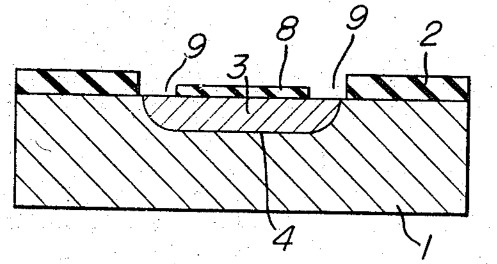

An n-type silicon substrate 1 having a resistivity of 1 ohm-cm and a thickness of 200 $\mu$ is polished, followed by a slight etching, and then heated at 1100° C. for 60 hours in an oxygen atmosphere including water vapor, resulting in the formation of a silicon dioxide film 2 6000 A. thick on the surface of the substrate 1 as shown in FIG. 7. Then, by applying the well-known photoengraving technique, a hole 7 is formed in the silicon dioxide film 2. Next, the specimen is put in a furnace kept at 950° C., in which boron bromide ($BBr_3$) vapor is allowed to flow for 20 minutes to deposite boron oxide ($B_2O_3$) on the surface of the specimen. During this process boron diffuses into the semiconductor substrate 1 shallowly and in high concentration. Then, a glass composed of boron oxide ($B_2O_3$) and silicon dioxide ($SiO_2$) formed on the surface of the specimen is removed by means of an etchant consisting of six parts of ammonium fluoride (NH4F) and one part of hydrofluoric acid (HF), after which the specimen is heated to 1150° C. in an oxidizing atmosphere to diffuse boron deposited at the hole portion 7 into the n-type substrate 1. By about 2 hours' heating a p-type diffused region 3 having a depth of 4 $\mu$ and a surface impurity concentration of $5 \times 10^{18}/cm^3$ is formed as shown in FIG. 8. During this diffusion treatment an oxide film 8 is again formed in the hole 7. Then the silicon dioxide film 2 is removed along the side of the hole 7 by means of the photoengraving technique to form an annular opening 9 having a width of 5 $\mu$ as shown in FIG. 9. This annular opening portion 9 covers the n-type inversion layer 18 shown in FIG. 5 including the exposed edge portion of junction 4. Next, this specimen is maintained in a boron bromide vapor atmosphere at 950° C. for about 10 min. to deposite boron oxide on the exposed surface of the semiconductor substrate 1 at the opening portion 9 and at the same time to slightly diffuse boron into the substrate, resulting in formation of a shallow p+-type diffused region 5 with high impurity concentration. During this diffusion process an oxide film 10 is formed in the opening 9. Since the impurity concentration in the p-type region 5 is about $10^{20}/cm^3$ and since the diffusion depth thereof is very small, the distribution of the impurity concentration in this region is roughly uniform.

Thus, obtained semiconductor device has a very high impurity concentration in the p-type diffused region 3 in the vicinity of the end portion of the junction 4 at the surface of the semiconductor substrate 1, and hence a charge density $N_{FB}$ of about $5 \times 10^{13}/cm^2$ or more is necessary for converting the conductivity-type thereof into n-type. Therefore, even if the device is subjected to a forced deterioration test, such as the conventional bias-heat treatment test, or even if some amount of positive charges are present in the silicon dioxide film covering the semiconductor substrate 1, the p -type diffused region 3 is hardly inverted. Thus, the characteristics thereof in normal operations are very stable. For example, a conventional device produced three defective specimens out of ten specimens when subjected to a bias-heat treatment at 200° C. and 50 volts for 1 hour, whereas a device according to the present invention produced no defective specimen even when subjected to a bias-heat treatment at 250° C. and 70 volts for 10 hours.

Since the purpose of the present invention is to prevent the inversion of conductivity-type of the surface portion of a p-type (or n-type) diffused region 3 in the vicinity of the end portion of a junction 4 formed in an n-type (or p-type) substrate 1, it is desirable to provide the high impurity concentration region 5 at the portion where the inversion layer 18 shown in FIG. 5 is expected to occur. Although the high impurity level p-type region 5 extends to a part of the n -type substrate region 1 beyond the junction 4 at the surface portion of the substrate in the above embodiment, this structure is an example to more perfectly prevent the conversion of the portion of the p-type region 3 near the junction into n -type and to facilitate manufacture. This structure never impairs the operation of the device.

Figure 14:
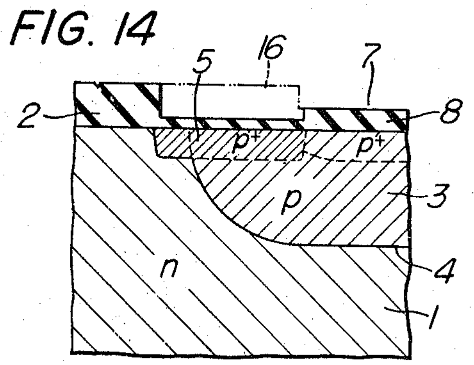
FIGS. 14 and 15 are enlarged cross sections of important portions of the structures according to the present invention.

When the high impurity level region 5 is not located in contact with the edge portion of the p-n junction 4 in the region 3, generation of an inversion layer at the surface portion of the region 3 existing between the edge portion of the p-n junction 4 and the region 5 cannot be prevented, and hence the effect of the present invention cannot be expected. Therefore, in the present invention, it is necessary for the high impurity level region 5 to be provided abutting on the edge portion of the p-n junction 4 along the whole length of the edge portion. A desirable location thereof is shown in FIG. 14. In FIG. 14 the high impurity level region 5 overlaps the edge portion of the opening 7 formed in the silicon oxide film 2 for the formation of the diffused region 3 and further extends beyond the edge portion of the p-n junction 4. A phantom line 16 indicates the position of the silicon oxide film 2 before the opening 9 in FIG. 9 is formed.

Figure 15:
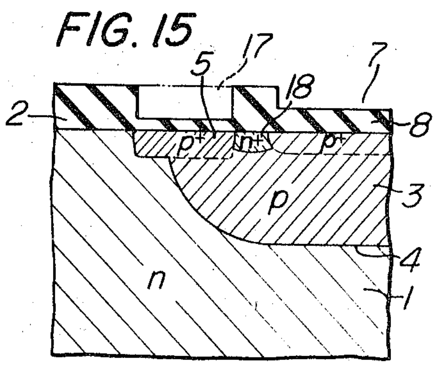

In the structure shown in FIG. 15 the p+-type region 5 is located so as not to contact the edge portion of the hole 7. Therefore, this structure is not necessarily desirable since there is a possibility that an n+-type inversion layer 18 will develop in the surface portion of the region 3 locating between the p+-type region 5 and the hole 7 portion under the oxide film 2. However, since the n+-type inversion region 18 is separated from the substrate region 1 by the p+-type region 5 the aforementioned abnormal increase in the backward current due to the tunnel phenomenon in a conventional structure can be prevented, and hence the purpose of the present invention can be sufficiently attained. A phantom line 17 in FIG. 15 indicates the position of the silicon oxide film 2 before the hole 9 is formed.

Figure 11:
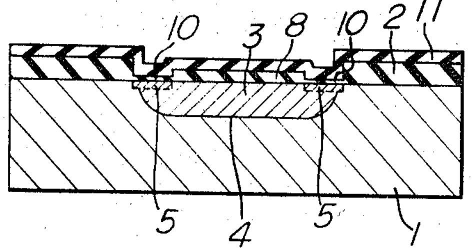
FIG. 11 is a cross-sectional view of another embodiment of the present invention.

In the above examples, since the diffusion time for forming the p -type region 5 is short, the oxide film 10 formed in the hole 9 is thin. Therefore, in order to completely protect the edge portion of the junction 4, it is desirable to form a further insulating film 11 on the insulating films 2, 8 and 10 as shown in FIG. 11. A silicon oxide film or silicon nitride film deposited from a vapor phase can be employed as this insulating film 11. Or, a lead oxide glass layer, silicate glass layer or the like can be employed.

Figure 12:
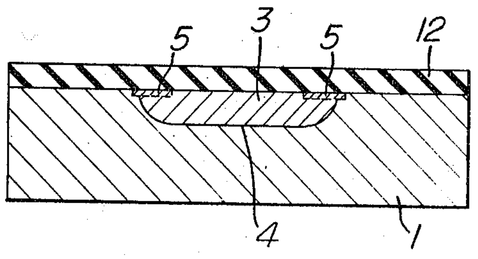
FIG. 12 is a cross-sectional view of still another embodiment of the invention.
Figure 10:
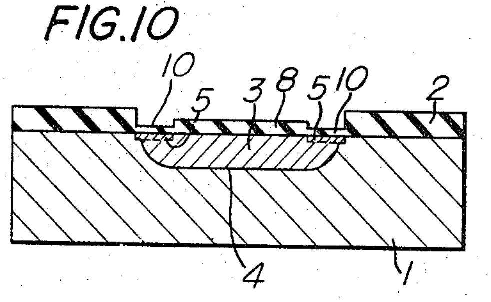

Alternatively, an insulating film 12 may well be formed again on the surface of the semiconductor substrate as shown in FIG. 12 after the oxide film having been employed as a mask for diffusion or formed in the course of diffusion has completely been removed from the surface of the semiconductor substrate. A silicon oxide film or silicon nitride film deposited from a vapor phase can be employed as the insulating film.

Figure 13:
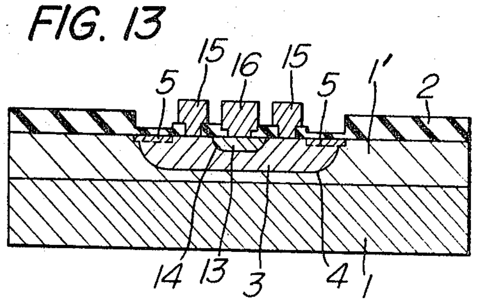
FIG. 13 is a cross-sectional view of a further embodiment of the invention.

An example of an application of the present invention to a transistor is shown in FIG. 13. In FIG. 13, reference numeral 1 designates an n+-type semiconductor region (serves as a collector region); 1' designates an n-type high resistivity semiconductor epitaxial region formed on the n+-type semiconductor region 1; 2 designates an insulating film; 3 designates a p-type diffused region (serves as a base region); 4 designates a collector-base junction; 5 designates a p+-type high-impurity-level inversion preventing region formed according to the present invention; 13 designates an n-type diffused region (serves as an emitter region), containing an n-type impurity such as phosphorus, formed by the well-known diffusion technique; 14 designates an emitter-base junction; and 15 and 16 designate a base electrode and an emitter electrode, respectively, which are made of, for example, aluminum. In the transistor, the collector-base junction 4 is biased in the backward direction when in operation, but, since the inversion preventing region 5 is formed in the surface portion of the base region 3 near the edge portion of the junction 4, the aforementioned abnormal increase in the backward current due to the tunnel effect current is prevented.

Besides the above-mentioned diodes and transistors, the present invention is applicable also to integrated circuitry. Further, in view of the spirit of the present invention, it is apparent that the semiconductor material employed in the present invention is not limited to silicon, but germanium or other semiconductor materials can also be employed.

We claim:

1. A semiconductor device comprising: a semiconductor region of one conductivity type having a surface; a diffused region of another conductivity type different from said one conductivity type formed in said surface of said semiconductor region, the concentration of the impurity determining said other conductivity type in said diffused region becoming smaller as it approaches the interface between said diffused region and said semiconductor region, said interface extending to said surface and defining an edge portion surrounding said diffused region at said surface; an insulating film covering at least the edge portion of said interface and a circumferential strip of the surface of said diffused region along the edge portion of said interface, said insulating film having a tendency to induce an inversion surface charge layer of said one conductivity type in the surface of said diffused region thereunder; and an inversion preventing layer of said other conductivity type formed in an annular shape in a circumferential strip of the surface of said diffused region along the edge portion of said interface and covering the edge portion of said interface with a sufficient impurity concentration and depth for canceling the inversion surface charge layer of said one conductivity type induced in said surface of said diffused region under said insulating film.

2. A semiconductor device according to claim 1, wherein said semiconductor region of said one conductivity type is composed of an n-type semiconductor with a relatively high resistivity and wherein said diffused region and said inversion preventing layer are of p-type.

3. A semiconductor device according to claim 1, further comprising a bias means operatively connected between said semiconductor region and said diffused region for biasing the interface between the regions in the backward direction.

4. A semiconductor device comprising: a substrate region composed of a semiconductor of one conductivity type having a substantially flat surface; a diffused region of another conductivity type different from said one conductivity type formed in the surface of said substrate region, said diffused region defining said substrate region an interface, the entire edge portion of which terminates at the surface, the concentration of the impurity determining said other conductivity type in said diffused region becoming smaller as it approaches said interface; an inversion preventing layer of said other conductivity type formed in an annular shape to cover a circumferential strip of the surface of said diffused region along the edge portion of said interface and the entire edge portion of said interface; and an insulating layer formed on said substantially flat surface including said inversion preventing layer formed in an annular shape; said inversion preventing layer having a sufficient impurity concentration and depth for canceling a surface charge layer of said one conductivity type induced by said insulating layer in said surface.

5. A semiconductor device according to claim 4, wherein said one conductivity type is n-type. said other conductivity type is p-type. and said insulating layer has a tendency to convert the conductivity type of the surface of said diffused region contacting said insulating layer into n -type.

6. A semiconductor device according to claim 4, wherein said substrate region is composed of n -type silicon, said other conductivity type is p -type, and said insulating layer includes silicon oxide.

7. A semiconductor device according to claim 4, further comprising a bias means operatively connected between said substrate region and said diffused region for biasing the interface between the regions in the backward direction.

8. A semiconductor device according to claim 4, wherein said semiconductor device further comprises a region of said one conductivity type formed in said diffused region, and said substrate region, said diffused region, and said region of said one conductivity type formed in said diffused region act as a collector, a base, an an emitter of a transistor, respectively.

9. A semiconductor device according to claim 4, wherein said inversion preventing layer is formed to cover the entire portion in which said impurity concentration at said surface of said diffused region becomes smaller as it approaches the interface.

10. A semiconductor device comprising:

a semiconductor substrate having a major surface;

a semiconductor region of one conductivity type and high resistivity formed in said substrate and extending to said major surface;

a diffused region of another conductivity type different from said one conductivity type formed in said semiconductor region and extending to said major surface, said diffused region defining with said semiconductor region an interface with the entire edge portion of which terminates at said major surface, and including a highly doped surface portion located in the major surface of said diffused region and spaced from the edge portion of said interface, the concentration of the impurity determining said other conductivity type in said diffused region becoming smaller as it approaches said interface;

an inversion preventing layer of said other conductivity type formed in an annular shape at least to cover the entire edge portion of said interface and a circumferential strip of the surface of said diffused region in the vicinity of said edge portion of said interface;

a film of an insulating material formed in contact with the major surface including said inversion preventing layer; and said inversion preventing layer having a sufficient impurity concentration and depth for canceling a surface charge layer induced by the existence of said film in said major surface.

11. The semiconductor device according to claim 10, wherein said inversion preventing layer is provided so as to bridge the highly doped surface portion of the diffused region and said semiconductor region surrounding said diffused region.

12. A transistor comprising:

a semiconductor substrate having a major surface;

a collector region of one conductivity type formed in said substrate and extending to said major surface;

a diffused base region of another conductivity type different from said one conductivity type formed in said collector region and extending to said major surface, the interface between the collector region and the diffused base region having an edge portion which terminates at said major surface, said base region including a highly doped surface portion located in the major surface of the base region and spaced from the edge portion of said interface, the concentration of the impurity determining said other conductivity type in said diffused base region becoming smaller as it approaches said interface;

an emitter region formed in said base region;

an inversion preventing layer of said other conductivity type formed in an annular shape at least to cover the entire edge portion of said interface and a circumferential strip of the surface of said diffused region in the vicinity of said edge portion of said interface;

a film of an insulating material formed in contact with the major surface including said inversion preventing layer; and said inversion preventing layer having a sufficient conductivity and depth for canceling a surface charge layer induced by the existence of said film in said major surface.

13. The transistor according to claim 12, wherein said inversion preventing layer is provided so as to bridge the highly doped surface portion of the diffused base region and said collector region surrounding the base region.

14. A semiconductor device comprising:

a semiconductor substrate having a major surface;

a semiconductor region of one conductivity type and high resistivity formed in said substrate and extending to said major surface;

a diffused region of another conductivity type different from said one conductivity type formed in said semiconductor region and extending to said major surface, said diffused region defining with said semiconductor region an interface the entire edge portion of which terminates at said major surface, and including a highly doped surface portion located in the major surface of said diffused region and spaced from the edge portion of said interface, the concentration of the impurity determining said other conductivity type in said diffused region becoming smaller as it approaches said interface;

a highly doped thin layer of said other conductivity type formed in said major surface to cover the entire edge portion of said interface and the entire surface of said diffused region existing between the edge portion of said interface and said highly doped surface portion of said diffused region; and a film of insulating material formed in contact with the major surface including said highly doped thin layer.

15. The semiconductor device according to claim 14, wherein said film comprises a first layer of silicon oxide and a second layer covering said first layer, said second layer consisting essentially of a substance selected from the group consisting of silicon oxide, silicon nitride, lead oxide glass and silicate glass.

16. The semiconductor device according to claim 14, wherein said film comprises a first layer of silicon oxide and a second layer of silicon nitride.